US010585513B2

(12) United States Patent
Park et al.

(10) Patent No.: US 10,585,513 B2
(45) Date of Patent: Mar. 10, 2020

(54) ELECTRONIC DEVICE INCLUDING FORCE SENSOR INTEGRATED WITH DISPLAY

(71) Applicant: Samsung Electronics Co., Ltd., Gyeonggi-do (KR)

(72) Inventors: Junghoon Park, Incheon (KR); Jungchul An, Gyeonggi-do (KR); Seunggoo Kang, Gyeonggi-do (KR); Yonghwa Kim, Gyeonggi-do (KR); Hyunwoo Sim, Gyeonggi-do (KR); Seungbum Choi, Gyeonggi-do (KR); Dongil Son, Gyeonggi-do (KR)

(73) Assignee: Samsung Electronics Co., Ltd (KR)

( * ) Notice: Subject to any disclaimer, the term of this patent is extended or adjusted under 35 U.S.C. 154(b) by 121 days.

(21) Appl. No.: 15/974,101

(22) Filed: May 8, 2018

(65) Prior Publication Data

US 2018/0321780 A1   Nov. 8, 2018

(30) Foreign Application Priority Data

May 8, 2017   (KR) .................. 10-2017-0057585

(51) Int. Cl.
  *G06F 3/041*   (2006.01)
  *G06K 9/00*   (2006.01)
  *H05K 1/18*   (2006.01)
  *G06F 3/044*   (2006.01)
  *H05K 1/14*   (2006.01)

(52) U.S. Cl.
  CPC ............ *G06F 3/0412* (2013.01); *G06F 3/041* (2013.01); *G06K 9/0002* (2013.01); *G06K 9/00087* (2013.01); *G06F 3/044* (2013.01); *G06F 2203/04105* (2013.01); *G06F 2203/04107* (2013.01); *G06K 9/00053* (2013.01); *H05K 1/147* (2013.01); *H05K 1/181* (2013.01); *H05K 1/189* (2013.01); *H05K 2201/056* (2013.01); *H05K 2201/10128* (2013.01); *H05K 2201/10151* (2013.01)

(58) Field of Classification Search
  CPC . G06F 2203/04105; G06F 2203/04107; G06F 3/041; G06F 3/0412; G06F 3/044; G06K 9/0002; G06K 9/00053; G06K 9/00087; H05K 1/147; H05K 1/181; H05K 1/189; H05K 2201/056; H05K 2201/10128; H05K 2201/10151
  See application file for complete search history.

(56) References Cited

U.S. PATENT DOCUMENTS

2016/0062498 A1\* 3/2016 Huppi .................. G06F 1/3287
  345/177
2016/0171281 A1\* 6/2016 Park ..................... G06F 1/1643
  382/124

(Continued)

*Primary Examiner* — Dmitriy Bolotin
(74) *Attorney, Agent, or Firm* — The Farrell Law Firm, P.C.

(57) ABSTRACT

An electronic device including a force sensor integrated with a display is provided. The electronic device includes a display; a biometric sensor disposed under the display; a circuit board including the biometric sensor on a first surface thereof; and a force sensor formed on a second surface of the circuit board. The force sensor comprises a first electrode layer facing the second surface; a dielectric layer disposed under the first electrode layer; and a second electrode layer disposed under the dielectric layer and connected to a ground of the electronic device.

19 Claims, 15 Drawing Sheets

(56) References Cited

U.S. PATENT DOCUMENTS

| | | |
|---|---|---|
| 2016/0269399 A1 | 9/2016 | Abreu |
| 2017/0013107 A1* | 1/2017 | Adams |
| 2017/0090024 A1* | 3/2017 | Kitchens, II ......... A61B 8/0858 |
| 2017/0090667 A1* | 3/2017 | Abdollahian ......... G06F 3/0418 |
| 2017/0323131 A1* | 11/2017 | Lu ........................ G01N 29/14 |
| 2018/0025202 A1* | 1/2018 | Ryshtun ............... G06K 9/0002 382/124 |
| 2018/0039368 A1* | 2/2018 | Choi ...................... G06F 3/016 |
| 2018/0042127 A1* | 2/2018 | Kim ..................... G06F 3/0412 |
| 2018/0129798 A1* | 5/2018 | He .................... G06K 9/00013 |
| 2018/0129849 A1* | 5/2018 | Strohmann ............ G06F 21/32 |
| 2018/0157411 A1* | 6/2018 | Kim ..................... G06F 3/0488 |
| 2018/0276439 A1* | 9/2018 | Strohmann ........... G06K 9/0002 |
| 2018/0276440 A1* | 9/2018 | Strohmann ........... G06K 9/0002 |
| 2018/0276443 A1* | 9/2018 | Strohmann .......... G06K 9/0012 |
| 2018/0284892 A1* | 10/2018 | Kwon ................ G06F 3/04817 |
| 2018/0293420 A1* | 10/2018 | Kim ................... H04M 1/0277 |
| 2018/0329560 A1* | 11/2018 | Kim .................... G06F 3/0414 |
| 2018/0365466 A1* | 12/2018 | Shim .................... G06F 3/0421 |
| 2019/0026527 A1* | 1/2019 | He ....................... G02B 6/0026 |
| 2019/0094967 A1* | 3/2019 | Bisbee .................. G06F 3/016 |

\* cited by examiner

ELECTRONIC DEVICE INCLUDING FORCE SENSOR INTEGRATED WITH DISPLAY

CROSS-REFERENCE TO RELATED APPLICATION(S)

This application is based on and claims priority under 35 U.S.C. § 119 to Korean Patent Application No. 10-2017-0057585, filed on May 8, 2017, in the Korean Intellectual Property Office, the disclosure of which is incorporated by reference herein in its entirety.

BACKGROUND

1. Field

The present disclosure relates generally to an electronic device including a force sensor integrated with a display.

2. Description of the Related Art

In a portable electronic device, as an occupying area of a display is gradually enlarged, a biometric sensor (e.g., a fingerprint sensor) ordinarily provided separately from the display may be integrated within the display of the portable electronic device. The portable electronic device may include a fingerprint sensor, as a biometric sensor in a lower area of the display, to recognize a user fingerprint based on a partial area of a display area of the display. The portable electronic device may also integrate a force sensor together with the fingerprint sensor and detect a pressure corresponding to a touch input using the force sensor. The portable electronic device may change a disposition structure of the force sensor based on a disposition structure of the fingerprint sensor.

In the portable electronic device, a pressure sensing performance through the force sensor may be diminished when the fingerprint sensor is integrated within the display. For example, the force sensor may be disposed at an outer portion of the fingerprint sensor based on a disposition structure of the fingerprint sensor. The force sensor may be disposed in a structure enclosing a periphery of the fingerprint sensor, except for an area corresponding to the fingerprint sensor. A pressure sensing performance of the force sensor may be diminished when disposed in an area corresponding to the fingerprint sensor.

SUMMARY

The present disclosure is made to address at least the above-mentioned problems and/or disadvantages and to provide at least the advantages described below.

In accordance with an aspect of the present disclosure, a force sensor can be disposed based on a fingerprint sensor integrated within a display.

In accordance with another aspect of the present disclosure, in order to minimize deterioration of a pressure sensing performance caused by a disposition structure of the fingerprint sensor, a disposition structure of the force sensor can be modified.

In accordance with another aspect of the present disclosure, a pressure sensing performance can be maintained regardless of the fingerprint sensor, and a pressure sensing function can be efficiently provided to a user.

According to an embodiment, a display; a biometric sensor disposed under the display; a circuit board including the biometric sensor on a first surface thereof; and a force sensor formed on a second surface of the circuit board. The force sensor includes a first electrode layer facing the second surface, a dielectric layer disposed under the first electrode layer, and a second electrode layer disposed under the dielectric layer and connected to a ground of the electronic device.

In accordance with another embodiment, an electronic device includes a display; a biometric sensor disposed under the display; a circuit board connected to the biometric sensor and disposed under the biometric sensor; and a force sensor formed between the biometric sensor and the circuit board. The force sensor includes a first electrode layer facing the biometric sensor, a dielectric layer disposed under the first electrode layer, and a second electrode layer disposed under the dielectric layer and connected to a ground of the electronic device, and the second electrode layer is formed in at least a portion of the circuit board.

BRIEF DESCRIPTION OF THE DRAWINGS

The above and other aspects, features, and advantages of certain embodiments will be more apparent from the following detailed description taken in conjunction with the accompanying drawings, in which.

DETAILED DESCRIPTION

Figure 1:
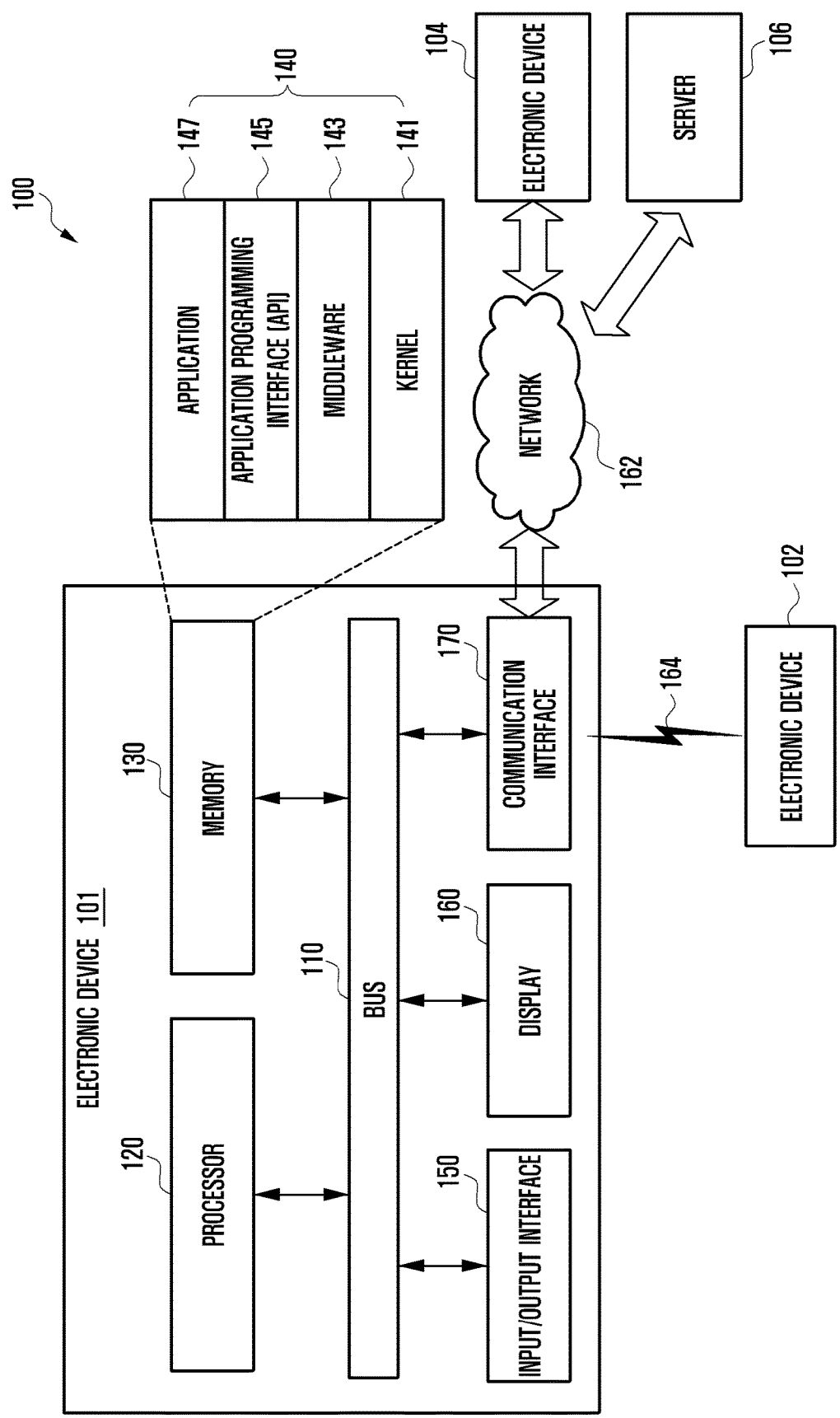
FIG. 1 illustrates an electronic device in a network environment, according to an embodiment.

Embodiments of the present disclosure are described with reference to the accompanying drawings. However embodiments of the present disclosure are not limited to specific embodiments, and it should be understood that modifications, equivalents, and/or alternatives of the embodiments described herein can be variously made. Descriptions of well-known functions and/or configurations will be omitted for the sake of clarity and conciseness. In connection with descriptions of the drawings, similar components may be designated by the same reference numeral.

The expressions "include", "have", "may include" or "may have" used herein may be construed to denote a certain characteristic, number, step, operation, constituent element, component or a combination thereof, and do not preclude the presence of additional features.

The expressions "or", "at least one of A and B", or "at least one of A or B" includes any or all combinations of the words listed together. For example, "A or B", "at least A and B", or "at least A or B" may include A, may include B, or may include both A and B.

As used herein, the terms "1st" or "2nd" and "first" or "second" may use corresponding components regardless of importance or order and are used to distinguish a component from another without limiting the components. For example, the above terms do not limit the sequence and/or importance of the components. The terms may be used for distinguishing one component from other components. For example, a first user device and a second user device may indicate different user devices although both of them are user devices. Further, without departing from the scope of the present disclosure, a first structural element may be referred to as a second structural element, and vice versa.

When it is stated herein that a component is "operatively coupled to", "communicatively coupled to" or "connected to" another component, the component may be directly coupled or connected to another component or a new component may exist between the component and another component. In contrast, when it is stated that a component is "directly coupled to" or "directly connected to" another component, a new component does not exist between the component and the other component.

The expression "configured to" or "set to" may be used interchangeably with "suitable for," "having the capacity to," "designed to," "adapted to," "made to," or "capable of." The expression "configured to" or "set to" may not be used to refer to only something in hardware for which it is "specifically designed to." Instead, the expression "a device configured to" may indicate that the device is "capable of" something with other devices or parts. For example, the expression "a processor configured to do A, B and C" or "set to do A, B and C" may refer to a dedicated processor (e.g., an embedded processor) or a generic-purpose processor (e.g., a central processing unit (CPU) or application processor (AP)) that may execute one or more software programs stored in a memory device to perform corresponding functions.

An electronic device may be a device including an antenna, such as a smart phone, a tablet personal computer (PC), a mobile phone, a video phone, an e-book reader, a desktop PC, a laptop PC, a netbook computer, a personal digital assistant (PDA), portable multimedia player (PMP), an MP3 player, a mobile medical application, a camera, and a wearable device, such as a head-mounted-device (HMD), electronic glasses, electronic clothes, an electronic bracelet, an electronic necklace, an electronic accessory, an electronic tattoo, and a smart watch.

The electronic device may be a smart home appliance having an antenna, such as a television (TV), a digital video disk (DVD) player, an audio player, an air conditioner, a cleaner, an oven, a microwave oven, a washing machine, an air purifier, a set-top box, a TV box such as Samsung HomeSync™, Apple TV™, or Google TV™, game consoles, an electronic dictionary, an electronic key, a camcorder, and an electronic frame.

The electronic device may include medical devices, such as a magnetic resonance angiography (MRA), a magnetic resonance imaging (MRI) device, a computed tomography (CT), a scanner, or an ultrasonic device, a navigation device, a global positioning system (GPS) receiver, an event data recorder (EDR), a flight data recorder (FDR), a vehicle infotainment device, electronic equipment for a ship, such as a navigation device for ship and a gyro compass, avionics, a security device, a head unit for a vehicle, an industrial or home robot, an automatic teller machine (ATM), and a point of sale (POS) device for shops.

The electronic device may also include furniture or a part of a building/structure, an electronic board, an electronic signature receiving device, a projector, and various types of measuring devices, such as a water meter, an electricity meter, a gas meter, and a radio wave meter, which are equipped with an antenna. The electronic device may also be a combination of the devices listed above. Further, the electronic device may be a flexible device. The electronic device is not limited to the above described devices.

FIG. 1 illustrates a network environment 100 including an electronic device 101, according to an embodiment.

Referring to FIG. 1, the electronic device 101, 102, and 104 may connect to the server 106 via the network 162 or short-wireless communication 164. The electronic device 101 includes a bus 110, a processor 120, a memory 130, an input/output interface 150, a display 160, and a communication interface 170. At least one of the above described components may be omitted from the electronic device 101 or another component may be further included in the electronic device 101.

The bus 110 may be a circuit connecting the above described components 120, 130, 150, 160, and 170. Thus bus 110 may further transmit communications (e.g., control messages and/or data) between the above described components.

The processor 120 may include a CPU, an AP, and a communication processor (CP). The processor 120 may control at least one of other component of the electronic device 101 and/or processing data or operations related to communication.

The memory 130 may include volatile memory and/or non-volatile memory. The memory 130 may store data or commands related to other components of the electronic device 101. The memory 130 may store software and/or a program module 140. The program module 140 may include a kernel 141, middleware 143, an application programming interface (API) 145, or application programs (or applications) 147. The kernel 141, middleware 143 or a part of the API 145 may be called an operating system (OS).

The kernel 141 may control or manage system resources, such as the bus 110, processor 120, or memory 130, used to execute operations or functions of other programs, such as the middleware 143, API 145, and application programs 147. The kernel 141 provides an interface capable of allowing the middleware 143, API 145, and application programs 147 to access and control/manage the individual components of the electronic device 101.

The middleware 143 may mediate between the API 145, the application programs 147 and the kernel 141 so that the API 145 or the application programs 147 can communicate and exchange data with the kernel 141. The middleware 143 may process one or more task requests received from the application programs 147 according to priority. The middleware 143 may assign a priority for using system resources of the electronic device 101 (e.g., the bus 110, the processor 120, and the memory 130) to at least one of the application programs 147. The middleware 143 may process one or more task requests according to a priority assigned to at least one of the application programs 147, thereby performing scheduling or load balancing for the task requests.

The API 145 refers to an interface configured to allow the application programs 147 to control functions provided by the kernel 141 or the middleware 143. The API 145 may include at least one interface or function (e.g., instructions) for file control, window control, image processing, or text control.

The input/output interface 150 is capable of transferring instructions or data received from the user or external devices to one or more components of the electronic device 101. The input/output interface 150 is capable of outputting instructions or data received from one or more components of the electronic device 101 to the user or external devices.

The display 160 may include a liquid crystal display (LCD), a flexible display, a transparent display, a light emitting diode (LED) display, an organic light emitting diode (OLED) display, micro-electro-mechanical systems (MEMS) display, or an electronic paper display. The display 160 may display various types of content, such as texts, images, videos, icons, and symbols. The display 160 may also be implemented with a touch screen. In this case, the display 160 is capable of receiving touches, gestures, proximity inputs or hovering inputs, via a stylus pen or a user's body.

The communication interface 170 may establish communication between the electronic device 101 and a first external device 102, a second electronic device 104, or a server 106. The communication interface 170 may communicate with a second external device 104 or a server 106 connected to the network 162 via wired or wireless communication.

Wireless communication may employ, as a cellular communication protocol, at least one of long-term evolution (LTE), LTE-advance (LTE-A), code division multiple access (CDMA), wideband CDMA (WCDMA), universal mobile telecommunications system (UMTS), wireless broadband (WiBro), and global system for mobile communication (GSM). The short-range communication 164 may be a wireless communication type and may include at least one of WiFi, light fidelity (LiFi), bluetooth, bluetooth low energy (BLE), Zigbee, near field communication (NFC), magnetic secure transmission, radio frequency (RF), body area network (BAN), magnetic secure transmission (MST), and global navigation satellite system (GNSS). The GNSS may include at least one of a global positioning system (GPS), global navigation satellite system (Glonass), Beidou navigation satellite system (Beidou), Galileo, and the European global satellite-based navigation system according to GNSS using areas or bandwidths.

"GPS" and "GNSS" may be used interchangeably. Wired communication may include at least one of a universal serial bus (USB), a high definition multimedia interface (HDMI), a recommended standard 232 (RS-232), and a plain old telephone service (POTS). The network 162 may include at least one telecommunications network, such as a computer network (e.g., LAN or WAN), the Internet, and a telephone network.

The first and second external electronic devices 102 and 104 are each an identical type or a different type from the electronic device 101. The server 106 may include a group of one or more servers. Part or all of the operations executed on the electronic device 101 may be executed on another electronic device or a plurality of other electronic devices (e.g., electronic devices 102 and 104 or a server 106).

When an electronic device needs to perform a function or service automatically or according to a request, it may not perform the function or service, and instead, additionally request at least a part of the function or service to be performed by other electronic devices (e.g., electronic devices 102 and 104 or a server 106). The other electronic devices may execute the requested function or additional functions, and transmit the result to the electronic device 101. The electronic device 101 may process the received result, or may further proceed with additional processes, to provide the requested function or service. To this end, the electronic device 101 may employ cloud computing, distributed computing, or client-server computing technology.

Figure 2:
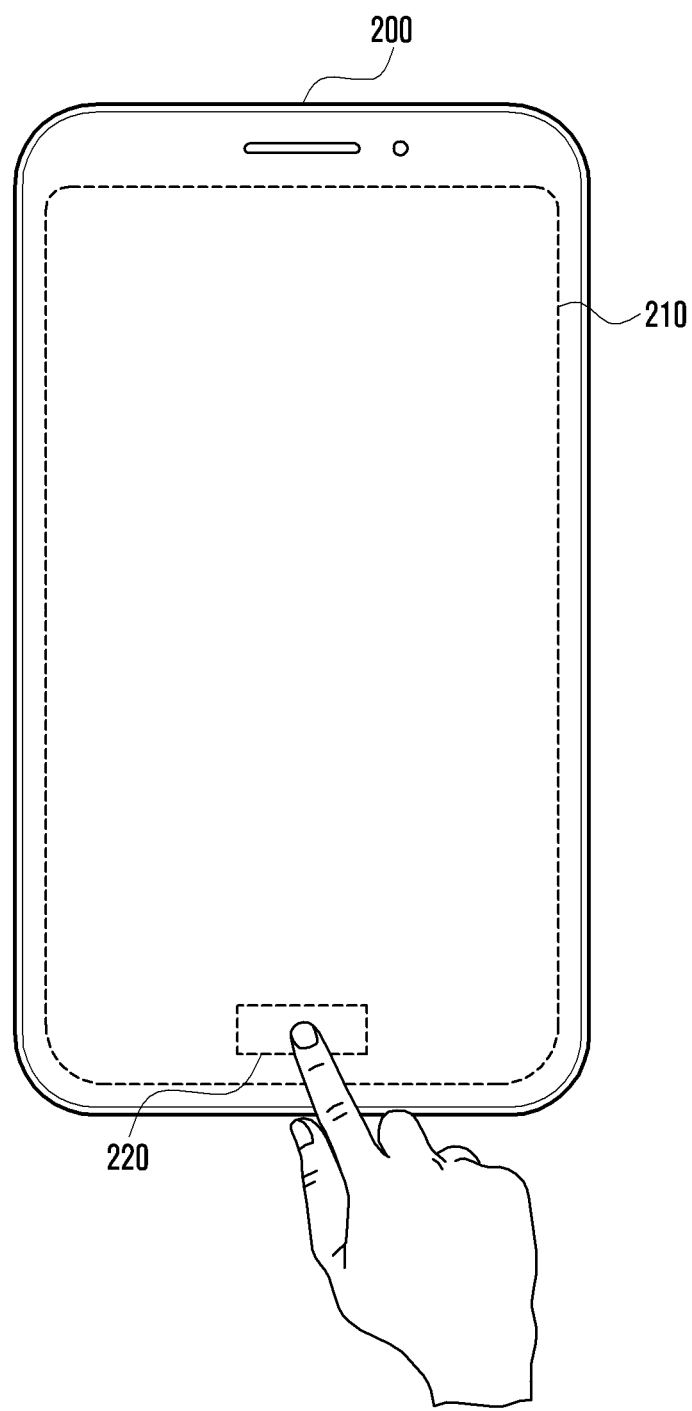
FIG. 2 illustrates a front surface of an electronic device having a biometric sensor integrated therein, according to an embodiment.

FIG. 2 illustrates a front surface of an electronic device having a biometric sensor integrated therein, according to an embodiment.

Referring to FIG. 2, an electronic device 200 may display a screen through a display module 210. In the electronic device 200, a biometric sensor may be disposed to correspond to a partial area 220 (e.g., a fingerprint detection area) of the display module 210. The electronic device 200 may obtain a user's fingerprint information received through the partial area 220 of the display module 210 using the biometric sensor. The electronic device 200 may perform a user authentication function based on the obtained user's fingerprint information. The electronic device 200 may integrate a force sensor therein, and the force sensor may be disposed to correspond to a disposition structure of the biometric sensor.

Figure 3A:
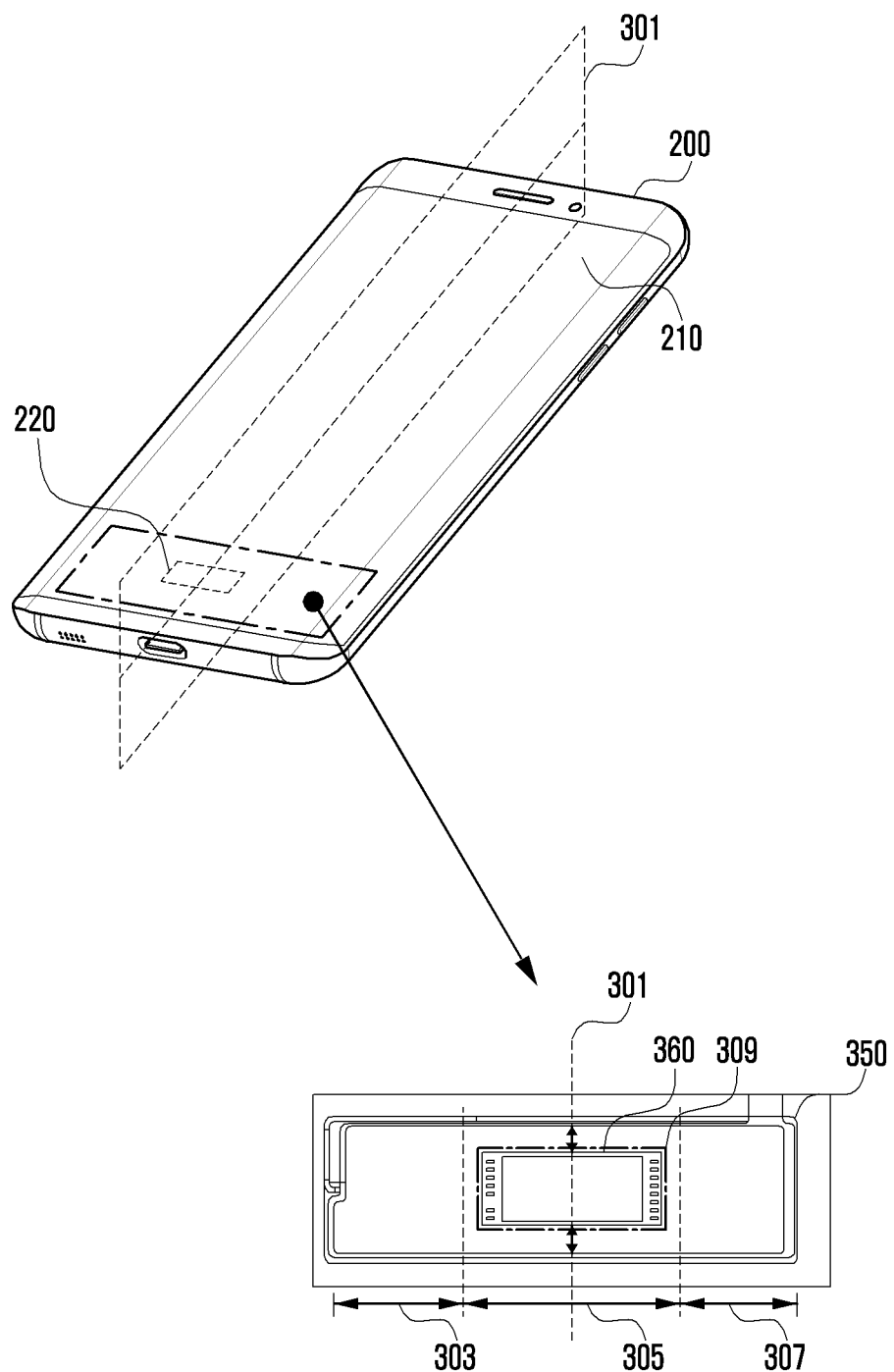
FIGS. 3A and 3B illustrate a force sensor corresponding to a biometric sensor integrated within an electronic device, according to an embodiment.
Figure 3B:
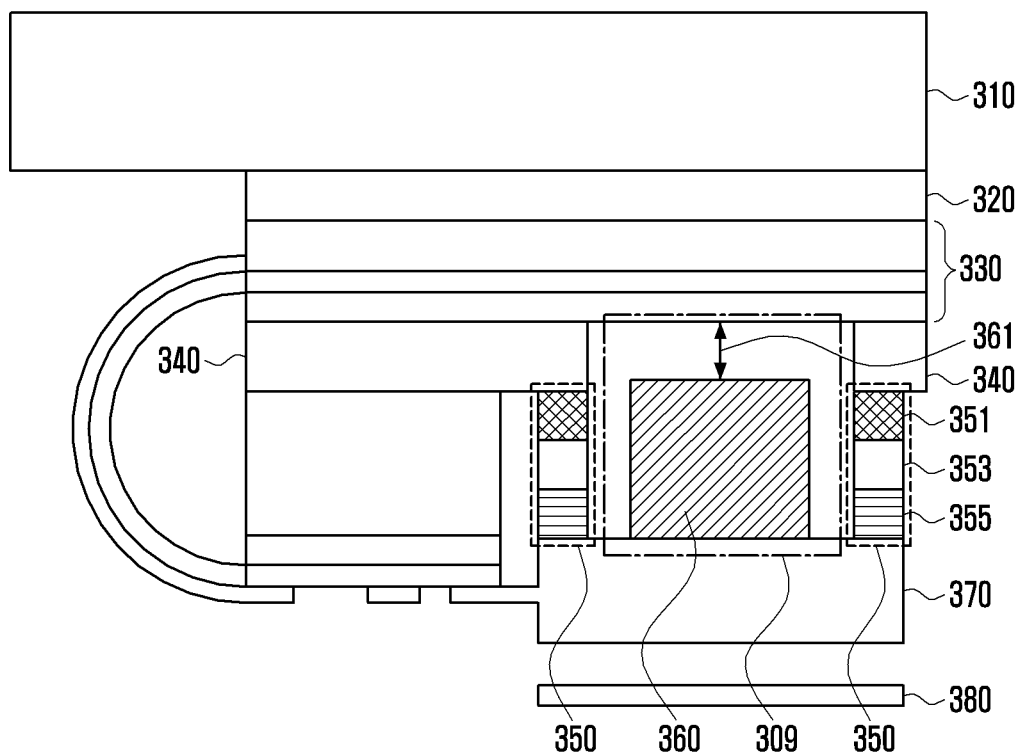

FIGS. 3A and 3B illustrate a force sensor disposed to correspond to a biometric sensor integrated within the electronic device, according to an embodiment.

Referring to FIG. 3A, the electronic device 200 may display a screen through the display module 210, and a biometric sensor 360 (e.g., a fingerprint sensor) may be disposed to correspond to the partial area 220 of the display module 210. In the electronic device 200, a force sensor 350 may be disposed adjacent to the biometric sensor 360.

The biometric sensor 360 may be disposed at the center of the force sensor 350, and the force sensor 350 may be divided into a first area 303, a second area 305, and a third area 307. The force sensor 350 may include an opening portion 309 corresponding to the biometric sensor 360 disposed at the center. The force sensor 350 may detect a pressure on each area basis based on the first area 303, the second area 305, and the third area 307. The first area 303 and the third area 307 may be an area not adjacent to the biometric sensor 360 and detect a pressure corresponding to a touch input. The second area 305 may correspond to an intermediate area of the force sensor 350 and may be an area in which the opening portion 309 is formed based on a disposition area of the biometric sensor 360. The second area 305 may be the remaining areas, except for a disposition area of the biometric sensor 360.

The second area 305 may be a relatively small area, compared with the first area 303 or the third area 307. A pressure sensing performance in the second area 305 may be lower than that in the first area 303 or the third area 307.

FIG. 3B is a cross-sectional view of the electronic device 200 taken along a vertical cross-section 301 of FIG. 3A.

Referring to FIG. 3B, the electronic device may have a structure in which a plurality of panels are stacked. The electronic device may include a transparent cover 310 for protecting a display module 330, a display module 330 for displaying a screen, a support member 340 for absorbing an impact corresponding to a touch input, a biometric sensor 360 for receiving a user's biometric information corresponding to a touch input, a force sensor 350 for detecting a pressure corresponding to a touch input, a printed circuit board (PCB) 370 (e.g., a flexible printed circuit board (FPCB)), and a bracket 380.

The transparent cover 310 (e.g., a window panel) is a transparent panel and may protect the display module 330 from an external impact. The transparent cover 310 may be disposed at the upper end of the display module 330 to protect the display module 330. The transparent cover 310 and the display module 330 may be attached to each other by an optical clear adhesive (OCA) 320.

The display module 330 may display a screen and detect a user's touch input. The display module 330 may include a touch screen panel. The display module 330 may detect a touch input based on at least one of capacitive, resistive, infrared, and ultrasonic methods. The display module 330 may be disposed at the lower end of the transparent cover 310 and be protected from an external impact through the transparent cover 310.

The support member 340 may absorb an impact on the display module 330 and include an embossed sheet including an uneven pattern, a cushion sheet including a sponge, and/or a black layer. The black layer may block or reflect light emitted from the display module 330 to advance to the downside of the display module 330 and may be integrally formed with the embossed sheet and/or the cushion sheet. The support member 340 may include an opening portion 309 such that an impact on the display module 330 is not transferred to a biometric sensor 360. The support member 340 may include an opening portion 309 corresponding to a size of the biometric sensor 360. The biometric sensor 360 may be disposed apart by a predetermined gap 361 (e.g., an air gap) from the display module 330 based on the opening portion 309 included in the support member 340.

The biometric sensor 360 may receive the user's biometric information and be attached to the upper end of the PCB 370. The biometric sensor 360 may be disposed under the display module 330. For protection from an impact transferred through the display module 330, the biometric sensor 360 may be disposed apart by a predetermined gap from the display module 330.

The force sensor 350 may detect a pressure corresponding to the user's touch input. The force sensor 350 may be disposed at a lower surface of the support member 340 and at an upper surface of the PCB 370. The force sensor 350 may include an opening portion 309 corresponding to a size of the biometric sensor 360. A size of the opening portion 309 included in the support member 340 and a size of the opening portion 309 included in the force sensor 350 may or may not be the same.

The force sensor 350 includes a first electrode layer 351 (e.g., a sensor pattern layer) for detecting a pressure corresponding to a touch input and a second electrode layer 355 (e.g., a ground (GND) layer) electrically connected to the GND of the electronic device to perform a GND function. A dielectric material 353 of an elastic property, or an air gap, may be formed between the first electrode layer 351 and the second electrode layer 355. The force sensor 350 may measure a voltage level difference between the first electrode layer 351 and the second electrode layer 355 and detect a pressure corresponding to a touch input based on the measured voltage difference. The force sensor 350 may measure a capacitance change amount corresponding to a gap change between the first electrode layer 351 and the second electrode layer 355 and detect intensity of a pressure based on the measured capacitance change.

The force sensor 350 includes a first electrode layer 351 and a second electrode layer 355. The dielectric material 353 of an elastic property, or an air gap, may be formed between the first electrode layer 351 and the second electrode layer 355. The first electrode layer 351 may be made of a coil, and the second electrode layer 355 may be made of a metal material. The force sensor 350 may measure a voltage level difference between the first electrode layer 351 and the second electrode layer 355 and detect a pressure corresponding to a touch input based on the measured voltage difference.

The force sensor 350 may be configured with a single electrode. The force sensor 350 may measure a resistance difference corresponding to a pressure transmitted to the single electrode and measure a voltage difference corresponding to the resistance difference. The force sensor 350 may detect a pressure corresponding to the touch input based on the measured voltage difference.

The force sensor 350 includes a first electrode layer 351 for detecting a pressure corresponding to the touch input, a second electrode layer 355 for performing a GND function, and a dielectric material 353 of an elastic property or an air-gap for measuring a voltage difference between the first electrode layer 351 and the second electrode layer 355.

The PCB 370 may be disposed at the lower end of the biometric sensor 360 and the force sensor 350, and the PCB 370 may secure a position of the biometric sensor 360 and the force sensor 350. The bracket 380 may be disposed under the PCB 370, and an air gap may be formed between the PCB 370 and the bracket 380 in a production process.

The bracket 380 may perform an antenna function in the electronic device of a metal material. The bracket 380 may be electrically connected to the PCB 370 and perform a ground (GND) function of the PCB 370.

the force sensor 350 may include an opening portion 309 corresponding to a size of the biometric sensor 360. A pressure sensing performance of the force sensor 350 may be deteriorated in an area (e.g., the second area 305 of FIG. 3A) corresponding to the opening portion 309. In the force sensor 350, a channel size for detecting a pressure may be reduced because of the opening portion 309. In order to enlarge a channel size of the force sensor 350, a disposition structure of the force sensor 350 may be changed.

Figure 4A:
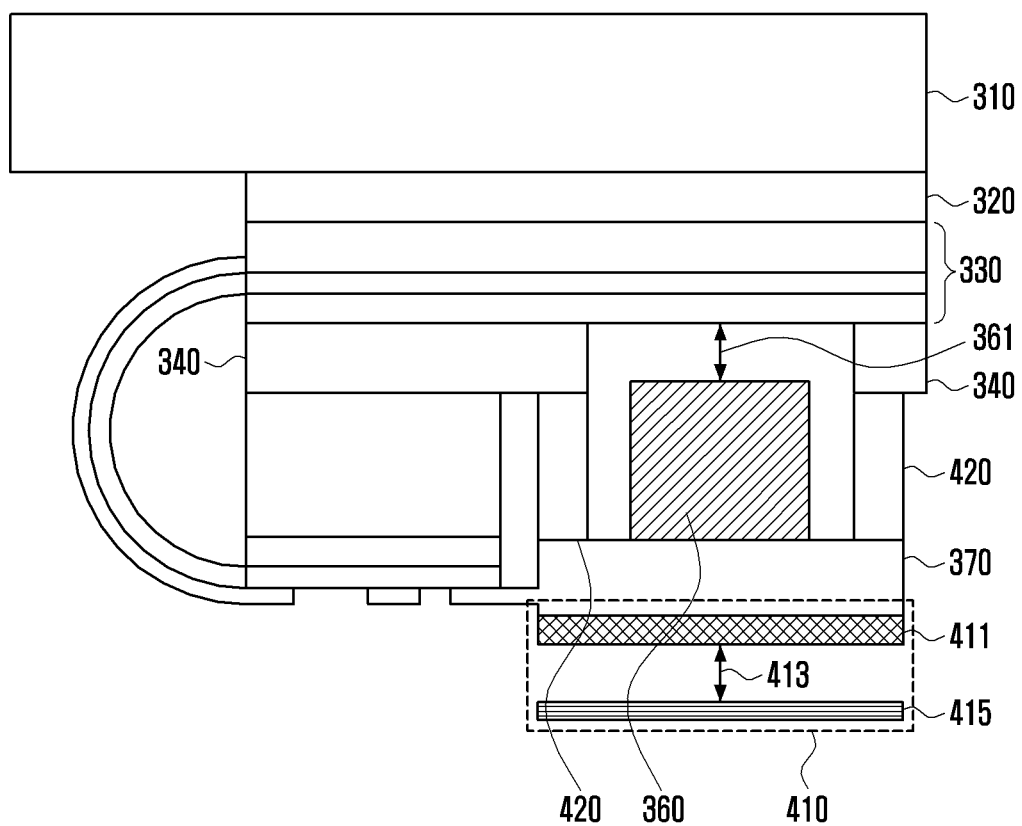
FIGS. 4A to 4C illustrate a first disposition structure of a force sensor, according to an embodiment.
Figure 4B:
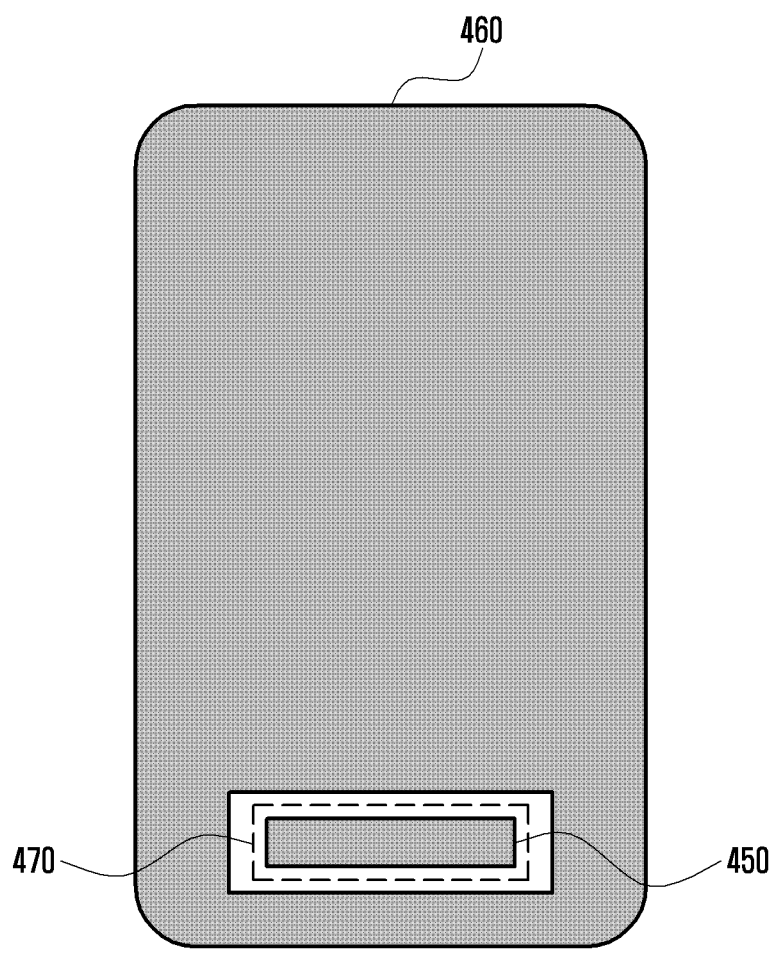
Figure 4C:
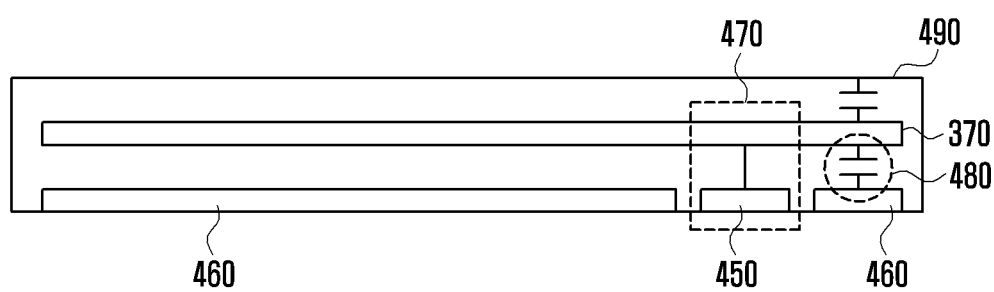

FIGS. 4A to 4C illustrate a first disposition structure of a force sensor, according to an embodiment.

Referring to FIG. 4A, the biometric sensor 360 is disposed under the display module 330, and an air gap 361 may be formed between the biometric sensor 360 and the display module 330. The support member 340 may be disposed under the display module 330, and a step compensation member 420 (e.g., a step compensation tape) may be disposed to correspond to a disposition structure of the biometric sensor 360 between the support member 340 and the PCB 370. The biometric sensor 360 may be disposed at the upper end of the PCB 370, and a force sensor 410 (e.g., the force sensor 350 of FIG. 3A) may be disposed at the lower end of the PCB 370. For example, at one surface (e.g., a first surface or an upper surface) of the PCB 370, the biometric sensor 360 may be disposed, and at the other surface of the PCB 370 (e.g., a second surface, a lower surface), the force sensor 410 may be disposed. A bracket 415 of the electronic device 200 may be disposed under the PCB 370, and the PCB 370 and the bracket 415 may be disposed apart by a predetermined gap. An air gap 413 may be formed between the PCB 370 and the bracket 415.

The force sensor 410 includes a first electrode layer 411 for detecting a pressure corresponding to a touch input and a second electrode layer 415 for performing a GND function of the force sensor 410. The force sensor 410 may include a dielectric material or the air gap 413 between the first electrode layer 411 and the second electrode layer 415. A bracket may be disposed under the PCB 370 and be used as the second electrode layer 415 of the force sensor 410.

The first electrode layer 411 of the force sensor 410 may be disposed at the other surface of the PCB 370, and a bracket, which is the second electrode layer 415, may be disposed at a position apart by a predetermined gap 413 from the first electrode layer 411. The force sensor 410 may separately form the second electrode layer 415, and the bracket included in the electronic device may be used as a portion of the second electrode layer 415. The bracket may correspond to the second electrode layer 415 and perform a GND function corresponding to the force sensor 410. The electronic device may measure a capacitance change amount corresponding to a change of the gap 413 between the first electrode layer 411 and the second electrode layer 415 and detect intensity of a pressure based on the measured capacitance change.

The bracket (e.g., a first bracket) used as the second electrode layer 415 may be distinguished from a bracket (e.g., a second bracket) configured to correspond to the antenna of the electronic device.

The force sensor 410 (e.g., the force sensor 350 of FIG. 3A) may be divided into a first area 303, a second area 305, and a third area 307 and detect a pressure corresponding to each area. Because the force sensor 410 is implemented under the PCB 370, the force sensor 410 may be implemented into one layer.

Referring to FIG. 4B, the bracket included in the electronic device may be divided into a first bracket 450 and a second bracket 460. The first bracket 450 may be formed based on a size of the force sensor 410 (e.g., the force sensor 350 of FIG. 3A). The second bracket 460 may be physically separated from the first bracket 450 and include an opening portion corresponding to a size of the first bracket 450. The first bracket 450 may be used as the second electrode layer 415 of the force sensor 410 and perform a direct current (DC) GND function corresponding to the force sensor 410. The electronic device may form a DC GND area 470 based on the first bracket 450 and perform a DC GND function based on the first bracket 450 in the DC GND area 470. The second bracket 460 may be configured to correspond to an antenna of the electronic device and perform an alternating current (AC) GND (e.g., antenna GND) function.

The first bracket 450 may be separately formed independently of the second bracket 460 and may be used as a second electrode layer 415 included in the force sensor 410.

FIG. 4C is a longitudinal cross-sectional view of the bracket of FIG. 4B.

Referring to FIG. 4C, the electronic device may be configured with a housing 490 of a metal material and receive a PCB 370. The first bracket 450 and the second bracket 460 may be disposed under the PCB 370. The second bracket 460 may be connected to the housing 490 of a metal material, and a metal exposed to the outside may be used as an antenna. In the electronic device, an alternating current (AC) may pass through based on the second bracket 460, and in order to prevent an electric shock, a DC may be blocked. In the electronic device, an electrical shock prevention capacitor 480 may be disposed between the PCB 370 and the second bracket 460 to block a DC current. The first bracket 450 may be connected to the PCB 370 and perform a ground function of a DC current. The first bracket 450 may be disposed independently of the second bracket 460 disposed at a periphery thereof and the housing 490 of a metal material. The electronic device may form a DC GND area 470 based on the first bracket 450 and perform a DC GND function based on the first bracket 450 in the DC GND area 470.

Figure 5:
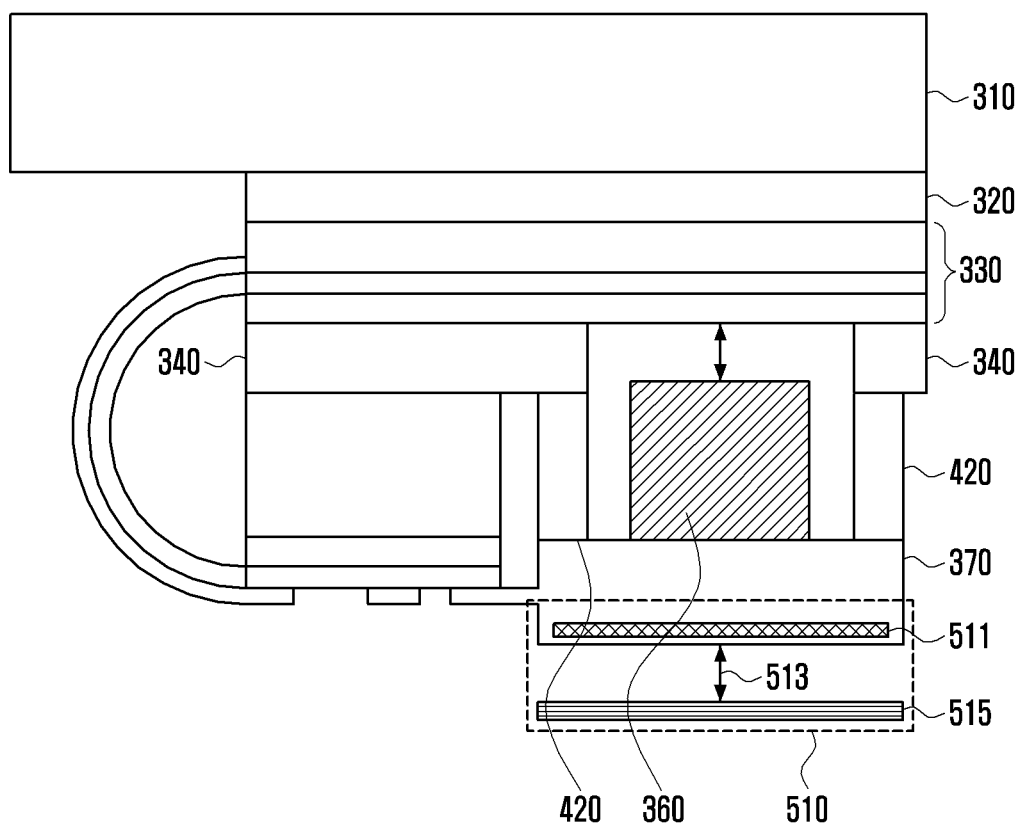
FIG. 5 illustrates a second disposition structure of a force sensor, according to an embodiment.

FIG. 5 illustrates a second disposition structure of a force sensor, according to an embodiment.

Referring to FIG. 5, a first electrode layer 511 of a force sensor 510 may be disposed within the PCB 370. A bracket, which is a second electrode layer 515 may be disposed at a position apart by a predetermined gap 513 from the PCB 370. The electronic device (e.g., the electronic device 200 of FIG. 2) may measure a capacitance change amount corresponding to a change of the gap 513 between the first electrode layer 511 and the second electrode layer 515 and detect intensity of the pressure based on the measured capacitance change.

Figure 6:
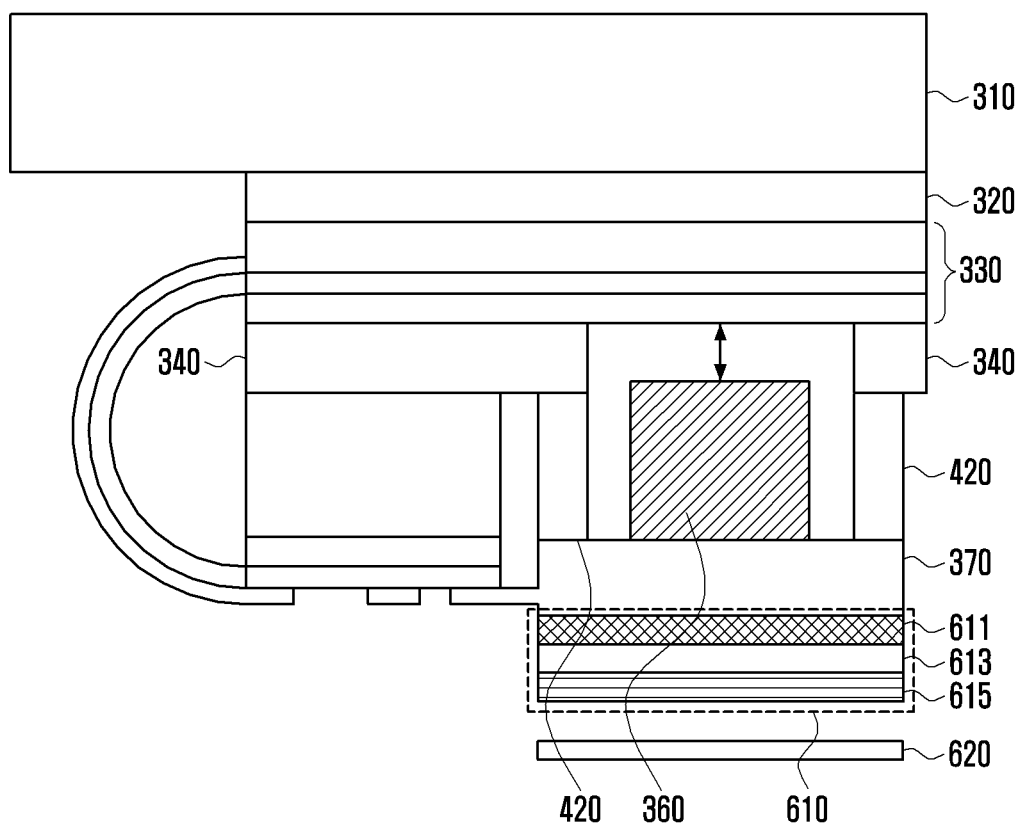
FIG. 6 illustrates a third disposition structure of a force sensor, according to an embodiment.

FIG. 6 illustrates a third disposition structure of a force sensor, according to an embodiment.

Referring to FIG. 6, a force sensor 610 may be disposed under the PCB 370 and may include a first electrode layer 611, dielectric material 613, and second electrode layer 615. The second electrode layer 615 of the force sensor 610 may be formed separately from a bracket 620. The second electrode layer 615 of the force sensor 610 may perform a DC GND function corresponding to the force sensor 610. The first electrode layer 611, the dielectric material 613, and the second electrode layer 615 may be disposed in this order under the PCB 370 and be used as the force sensor 610. The electronic device may measure a capacitance change amount corresponding to a thickness change of the dielectric material 613 disposed between the first electrode layer 611 and the second electrode layer 615 and detect an intensity of a pressure based on the measured capacitance change amount.

The bracket 620 configured to correspond to the antenna of the electronic device may be disposed under the force sensor 610. The bracket 620 may be at least partially used as the antenna of the electronic device and perform an AC GND function, and the second electrode layer 615 of the force sensor 610 may perform a DC GND function of the force sensor 610.

An electronic device according to an embodiment may include a display module; a biometric sensor disposed under the display module; a circuit board having the biometric sensor at a first surface; and a force sensor formed at a second surface of the circuit board, wherein the force sensor includes a first electrode layer facing the second surface, a dielectric layer disposed under the first electrode layer, and a second electrode layer disposed under the dielectric layer and connected to the ground of the electronic device.

Figure 7:
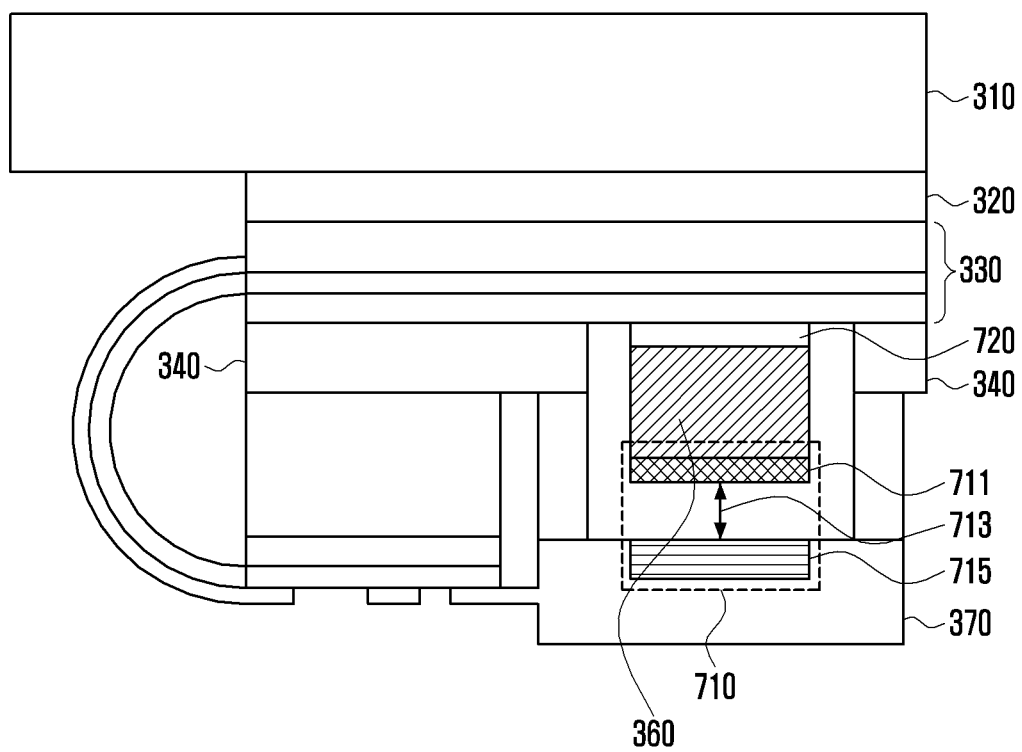
FIG. 7 illustrates a fourth disposition structure of a force sensor, according to an embodiment.

FIG. 7 illustrates a fourth disposition structure of a force sensor, according to an embodiment.

Referring to FIG. 7, the biometric sensor 360 may be disposed under the display module 330 and may be attached to a lower surface of the display module 330 using an OCA 720. A first electrode layer 711 of a force sensor 710 may be attached to a lower surface of the biometric sensor 360. An upper surface of the biometric sensor 360 may be attached to the display module 330 through the OCA 720, and the first electrode layer 711 of the force sensor 710 may be attached to a lower surface of the biometric sensor 360. A PCB 370 may be disposed under the biometric sensor 360. A second electrode layer 715 of the force sensor 710 may be disposed to an upper surface of the PCB 370. The first electrode layer 711 disposed at a lower surface of the biometric sensor 360 and the second electrode layer 715 disposed at an upper surface of the PCB 370 may be formed apart by an air gap 713 of a predetermined gap. The force sensor 710 may be formed based on the first electrode layer 711 attached to a lower surface of the biometric sensor 360 and the second electrode layer 715 disposed at an upper surface of the PCB 370. The force sensor 710 may use the spaced air gap 713 between the biometric sensor 360 and the PCB 370 as a dielectric material of the force sensor 710.

When using the air gap 713 as the dielectric material, the first electrode layer 711 of the force sensor 710 may move to the lower end by the user's pressing pressure, and a distance between the first electrode layer 711 and the second electrode layer 715 may be reduced based on the movement. Accordingly, a dielectric constant may be changed, and the user's pressing pressure may be measured based on the dielectric constant. The force sensor 710 may be implemented based on a size of the biometric sensor 360.

Referring again to FIG. 3A, the force sensor 350 may be divided into the first area 303, second area 305, and third area 307. The force sensor 350 may be implemented based on each different layer or may be implemented based on a single layer corresponding to three areas. The force sensor 710 of FIG. 7 may be implemented to correspond to the second area 305 and be different from a force sensor implemented to correspond to the first area 303 and the third area 307.

Figure 8:
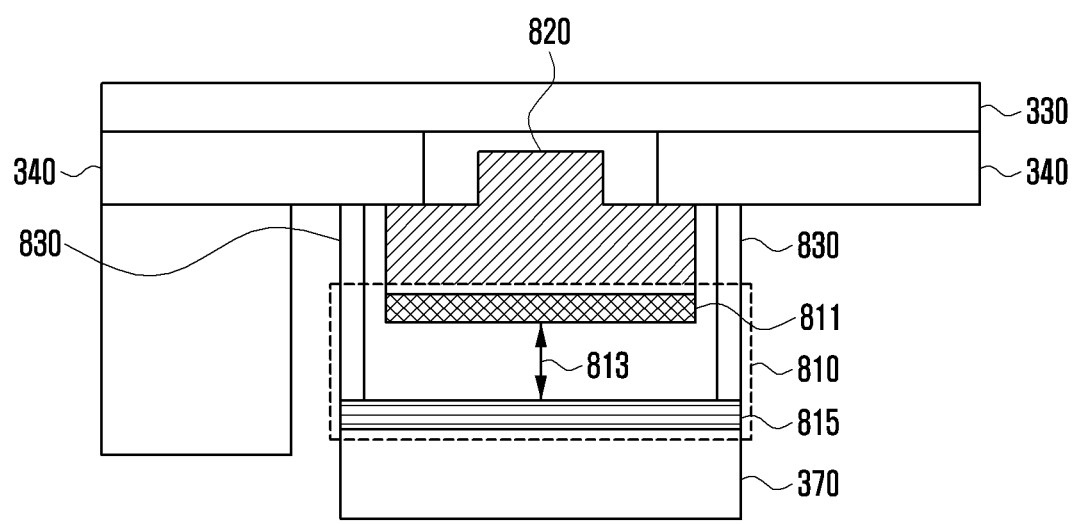
FIG. 8 illustrates a fifth disposition structure of a force sensor, according to an embodiment.

FIG. 8 illustrates a fifth disposition structure of a force sensor, according to an embodiment.

Referring to FIG. 8, a biometric sensor 820 may be disposed under a display module 330, and a portion of an upper surface of the biometric sensor 820 may be attached to a lower face of the support member 340. The biometric sensor 820 may be disposed apart by a predetermined gap from the display module 330. A portion of the biometric sensor 820 may be implemented in a concave or a convex shape to be attached to the support member 340. A first electrode layer 811 of a force sensor 810 may be attached to a lower surface of the biometric sensor 820. The PCB 370 may be disposed under the biometric sensor 820, and a second electrode layer 815 of the force sensor 810 may be attached to an upper surface of the PCB 370. The first electrode layer 811 attached to a lower surface of the biometric sensor 820 and the second electrode layer 815 attached to an upper surface of the PCB 370 may be disposed apart by a predetermined gap 813. The force sensor 810 may be formed based on the first electrode layer 811 attached to a lower surface of the biometric sensor 820 and the second electrode layer 815 disposed at an upper surface of the PCB 370. The force sensor 810 may use a spaced air gap 813 between the first electrode layer 811 and the second electrode layer 815 as a dielectric material. The PCB 370 may be attached to a lower surface of the support member 340 through a step compensation member 830.

The biometric sensor 820 may be implemented into a concave or a convex shape to be attached to a lower surface of the support member 340. The force sensor 810 may be formed under the biometric sensor 820 and may be formed based on the first electrode layer 811 attached to a lower surface of the biometric sensor 820 and the second electrode layer 815 attached to an upper surface of the PCB 370. The force sensor 810 may use a gap between the first electrode layer 811 and the second electrode layer 815 as the air gap 813 corresponding to the force sensor 810. The force sensor 810 may detect a pressure corresponding to the user's touch input based on the first electrode layer 811, the air gap 813, and the second electrode layer 815.

Figure 9:
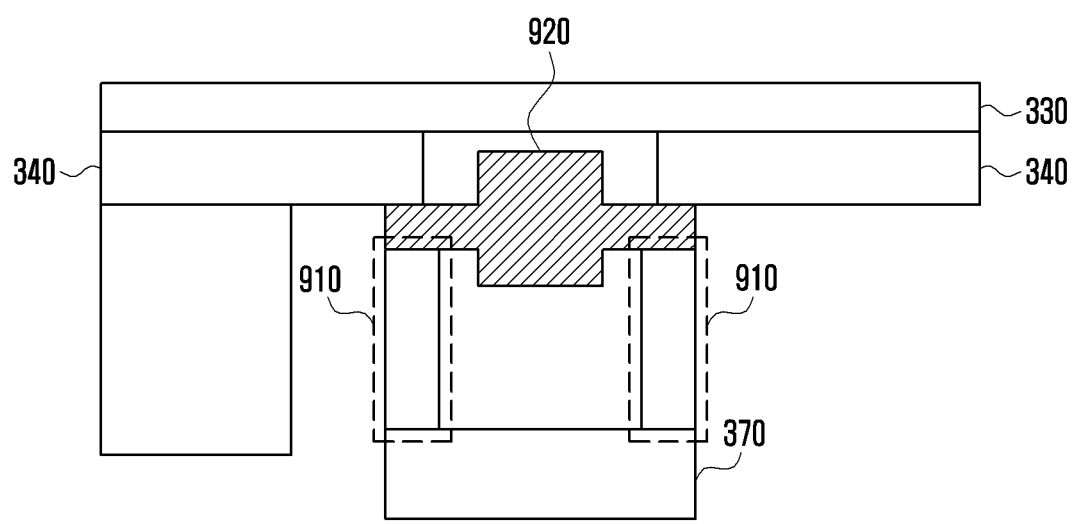
FIG. 9 illustrates a sixth disposition structure of a force sensor, according to an embodiment.

FIG. 9 illustrates a sixth disposition structure of a force sensor, according to an embodiment.

Referring to FIG. 9, a biometric sensor 920 implemented into a concave or a convex shape may be disposed under the display module 330, and a portion of an upper surface of the biometric sensor 920 may be attached to a lower surface of the support member 340. The PCB 370 may be disposed under the biometric sensor 920. A force sensor 910 may be disposed between the biometric sensor 920 and the PCB 370, and the force sensor 910 may be attached to a portion of a lower surface of the biometric sensor 920. As the biometric sensor 920 is implemented into a concave and convex shape, the force sensor 910 formed in an existing disposition structure may be used, and a cost according to production of the force sensor 910 may be reduced. The force sensor 910 may include a first electrode layer, a second electrode layer, and a dielectric material.

The biometric sensor 920 may be implemented into a concave and convex shape to be attached to a lower surface of the support member 340. The force sensor 910 may be disposed to correspond to a portion of a lower surface of the biometric sensor 920. The force sensor 910 may include a first electrode layer, a second electrode layer, and a dielectric material.

Figure 10:
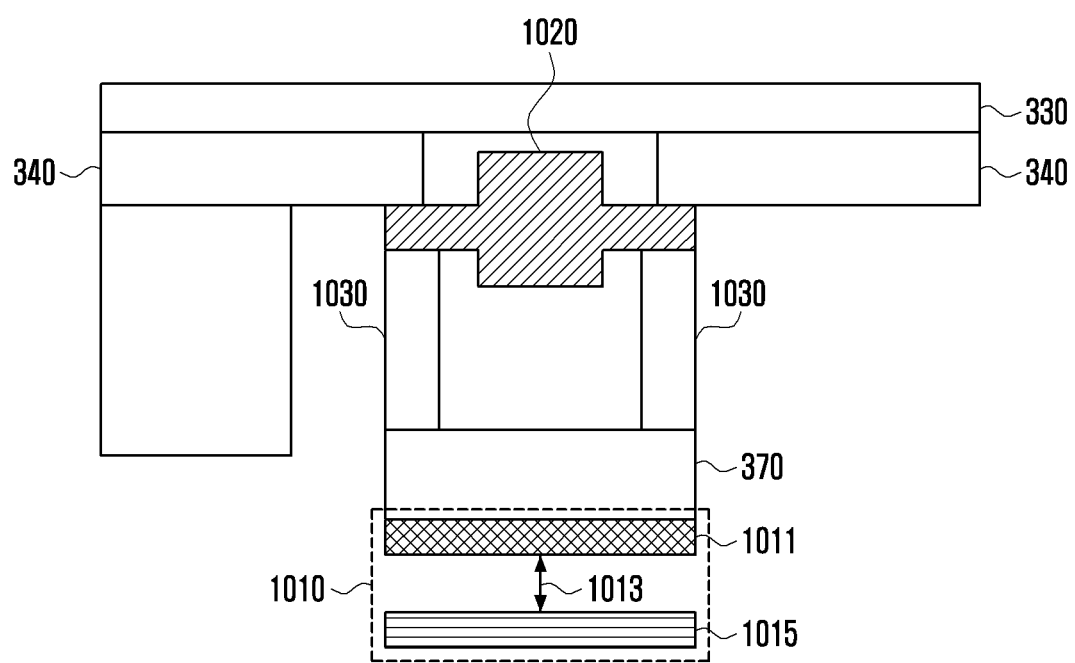
FIG. 10 illustrates a seventh disposition structure of a force sensor, according to an embodiment.

FIG. 10 illustrates a seventh disposition structure of a force sensor according to an embodiment.

Referring to FIG. 10, a biometric sensor 1020 implemented into a concave or and convex shape may be disposed under the display module 330, and a portion of an upper surface of the biometric sensor 1020 may be attached to a lower surface of the support member 340. The PCB 370 may be disposed under the biometric sensor 1020, and the biometric sensor 1020 and the PCB 370 may be connected using a step compensation member 1030. A first electrode layer 1011 of a force sensor 1010 may be attached to a lower surface of the PCB 370. A bracket 1015 may be disposed under the PCB 370, and the PCB 370 and the bracket 1015 may be disposed apart by a predetermined gap. The bracket 1015 may be used as a second electrode layer 1015 of the force sensor 1010. The force sensor 1010 may be formed based on the first electrode layer 1011 attached to a lower surface of the PCB 370 and the second electrode layer 1015 implemented into the bracket. The force sensor 1010 may use the spaced gap 1013 between the first electrode layer 1011 attached to a lower surface of the PCB 370 and the second electrode layer 1015 implemented into the bracket as a dielectric material or an air gap corresponding to the force sensor 1010.

The biometric sensor 1020 may be implemented into a concave or a convex shape to be attached to a lower surface of the support member 340. The PCB 370 may be disposed under the biometric sensor 1020, and the force sensor 1010 may be implemented in a form attached to a lower surface of the PCB 370. The first electrode layer 1011 of the force sensor 1010 may be attached to a lower surface of the PCB 370, and the bracket disposed under the PCB 370 may be used as the second electrode layer 1015 of the force sensor 1010. The first electrode layer 1011 and the second electrode layer 1015 may be disposed apart by a predetermined gap 1013. The force sensor 1010 may be implemented based on the first electrode layer 1011, the second electrode layer 1015, and a separated gap 1013 between the first electrode layer 1011 and the second electrode layer 1015.

An electronic device according to an embodiment may include a display module; a biometric sensor disposed under the display module; a circuit board connected to the biometric sensor and disposed under the biometric sensor; and a force sensor formed between the biometric sensor and the circuit board, wherein the force sensor includes a first electrode layer facing the biometric sensor, a dielectric layer disposed under the first electrode layer, and a second electrode layer disposed under the dielectric layer and connected to the ground of the electronic device, and wherein the second electrode layer is formed in at least a portion of the circuit board.

Figure 11:
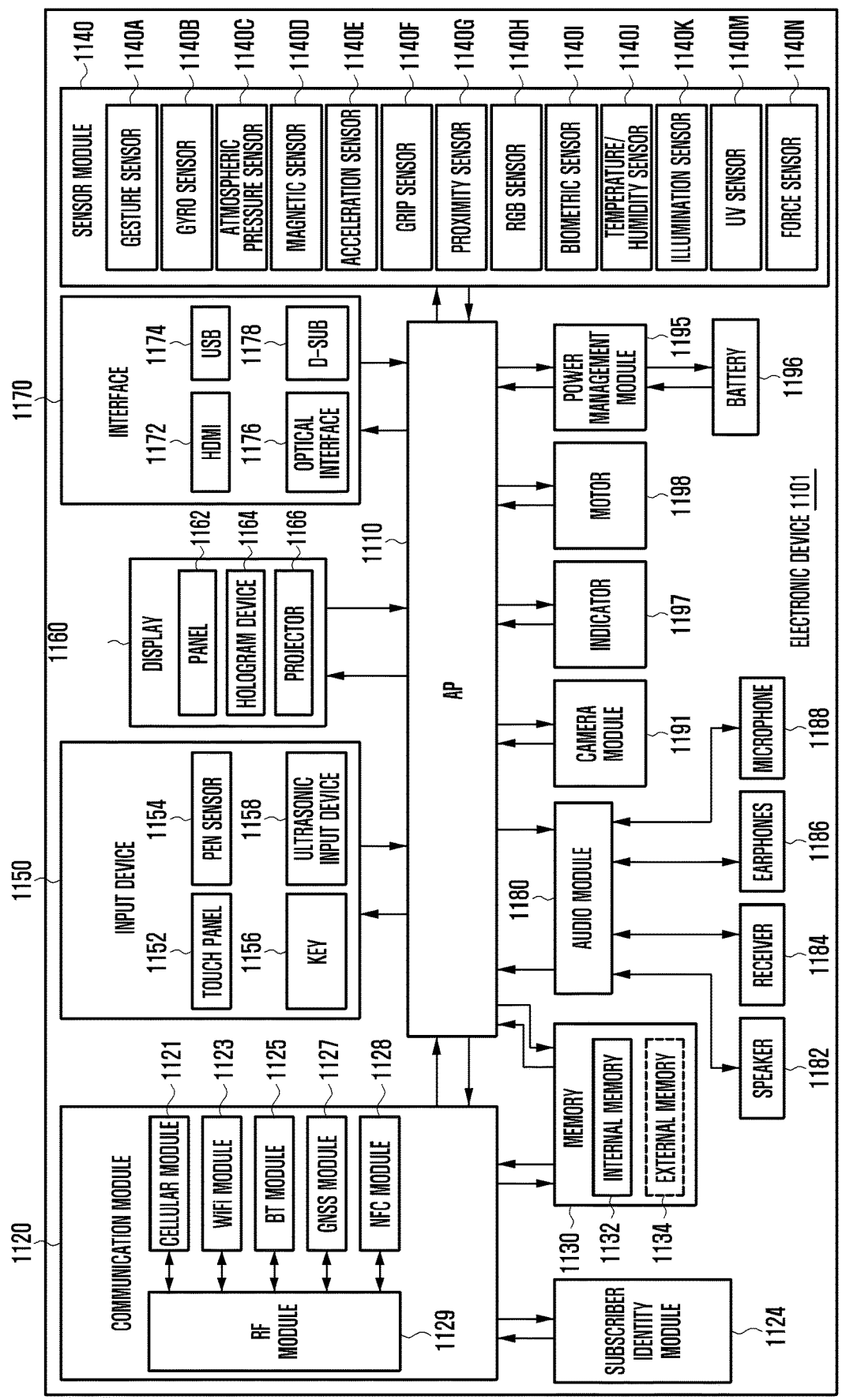
FIG. 11 illustrates an electronic device, according to an embodiment.

FIG. 11 illustrates an electronic device 1101 according to an embodiment.

Referring to FIG. 11, the electronic device 1101 may include a part or all of the components in the electronic device 101 shown in FIG. 1. The electronic device 1101 includes one or more processors 1110 (e.g., APs), a communication module 1120, a subscriber identification module (SIM) 1124, a memory 1130, a sensor module 1140, an input device 1150, a display 1160, an interface 1170, an audio module 1180, a camera module 1191, a power management module 1195, a battery 1196, an indicator 1197, and a motor 1198.

The processor 1110 may drive an OS or an application program to control a plurality of hardware or software components connected to the processor 1110, process various data, and perform operations. The processor 1110 may be implemented as a system on chip (SoC). The processor 1110 may further include a graphic processing unit (GPU) and/or an image signal processor. The processor 1110 may also include at least some of the components shown in FIG. 11 (e.g., a cellular module 1121). The processor 1110 is capable of loading commands or data received from at least one other component (e.g., a non-volatile memory) on a volatile memory and processing the loaded commands or data. The processor 1110 is capable of storing various data in a non-volatile memory.

The communication module 1120 may include the same or similar configurations as the communication interface 170 shown in FIG. 1. For example, the communication module 1120 is capable of including a cellular module 1121, a WiFi module 1123, a BT module 1125, a GNSS module 1127 (e.g., a GPS module, Glonass module, Beidou module or Galileo module), an NFC module 1128, and an RF module 1129.

The cellular module 1121 is capable of providing a voice call, a video call, an SMS service, and an Internet service through a communication network. The cellular module 1121 may identify and authenticating an electronic device 1101 in a communication network by using a SIM 1124 (e.g., a SIM card). The cellular module 1121 may perform at least part of the functions provided by the processor 1110. The cellular module 1121 is also capable of including a communication processor (CP).

Each of the WiFi module 1123, the BT module 1125, the GNSS module 1127, and the NFC module 1128 may include a processor for processing data transmitted or received through the corresponding module. At least one or more of the cellular module 1121, the WiFi module 1123, the BT module 1125, the GNSS module 1127, and the NFC module 1128 may be included in one integrated chip (IC) or one IC package.

The RF module 1129 may transmit or receive communication signals (e.g., RF signals). The RF module 1129 may include a transceiver, a power amp module (PAM), a frequency filter, a low noise amplifier (LNA), and an antenna. At least one of the cellular module 1121, the WiFi module 1123, the BT module 1125, the GNSS module 1127, and the NFC module 1128 may transmit or receive RF signals through the separate RF module 1129.

The SIM module 1124 may include a card including a SIM and/or an embedded SIM. The SIM module 1124 may also contain unique identification information, such as an integrated circuit card identifier (ICCID), or subscriber information, such as an international mobile subscriber identity (IMSI).

The memory 1130 may include a built-in memory 1132 or an external memory 1134. The built-in memory 1132 may include at least one of a volatile memory, such as a dynamic RAM (DRAM), a static RAM (SRAM), or a synchronous dynamic RAM (SDRAM); and a non-volatile memory, such as a one-time programmable ROM (OTPROM), a programmable ROM (PROM), an erasable and programmable ROM (EPROM), an electrically erasable and programmable ROM (EEPROM), a mask ROM, a flash ROM, a flash memory (e.g., a NAND flash memory and a NOR flash memory), a hard drive, and a solid state drive (SSD).

The external memory 1134 is also capable of including a flash drive, such as a compact flash (CF), a secure digital (SD), a micro secure digital (Micro-SD), a mini secure digital (Mini-SD), an extreme digital (xD), a multi-media card (MMC), and a memory stick. The external memory 1134 may be connected to the electronic device 1101, functionally and/or physically, through various interfaces.

The sensor module 1140 may measure or detect a physical quantity or an operation state of the electronic device 1101, and convert the measured or detected information into an electronic signal. The sensor module 1140 may include at least one of a gesture sensor 1140A, a gyro sensor 1140B, an atmospheric pressure sensor 1140C, a magnetic sensor 1140D, an acceleration sensor 1140E, a grip sensor 1140F, a proximity sensor 1140G, a color sensor 1140H (e.g., a red, green and blue (RGB) sensor), a biometric sensor 1140I, a temperature/humidity sensor 1140J, an illuminance sensor 1140K, and a ultraviolet (UV) sensor 1140M. Additionally or alternatively, the sensor module 1140 may further include an E-nose sensor, an electromyography (EMG) sensor, an electroencephalogram (EEG) sensor, an electrocardiogram (ECG) sensor, an infrared (IR) sensor, an iris sensor and/or a fingerprint sensor. The sensor module 1140 may further include a control circuit for controlling one or more sensors included therein. The electronic device 1101 may include a processor, configured as part of the processor 1110 or as a separate component, for controlling the sensor module 1140. In this case, while the processor 1110 is operating in a sleep mode, the processor may control the sensor module 1140.

The input device 1150 may include a touch panel 1152, a (digital) pen sensor 1154, a key 1156, or an ultrasonic input unit 1158. The touch panel 1152 may be implemented with at least one of a capacitive touch system, a resistive touch system, an infrared touch system, and an ultrasonic touch system. The touch panel 1152 may further include a control circuit and a tactile layer to provide a tactile response to the user.

The (digital) pen sensor 1154 may be implemented with a part of the touch panel or with a separate recognition sheet. The key 1156 may include a physical button, an optical key, or a keypad. The ultrasonic input unit 1158 may detect ultrasonic waves, created by an input tool, through a microphone 1188, and identify data corresponding to the detected ultrasonic waves.

The display 1160 may include a panel 1162, a hologram unit 1164, or a projector 1166. The panel 1162 may include the same or similar configurations as the display 160 shown in FIG. 1. The panel 1162 may be implemented to be flexible, transparent, or wearable. The panel 1162 may also be incorporated into one module together with the touch panel 1152. The hologram unit 1164 may show a stereoscopic image in the air by using light interference. The projector 1166 may display an image by projecting light onto a screen. The screen may be located inside or outside of the electronic device 1101. The display 1160 may further include a control circuit for controlling the panel 1162, the hologram unit 1164, or the projector 1166.

The interface 1170 may include a high-definition multimedia interface (HDMI) 1172, a universal serial bus (USB) 1174, an optical interface 1176, or a D-subminiature (D-sub) 1178. The interface 1170 may be included in the communication interface 170 shown in FIG. 1. Additionally or alternatively, the interface 1170 may include a mobile high-definition link (MHL) interface, an SD card/MMC interface, or an Infrared Data Association (IrDA) standard interface.

The audio module 1180 may provide bidirectional conversion between a sound and an electrical signal. At least part of the components in the audio module 1180 may be included in the input/output interface 150 shown in FIG. 1. The audio module 1180 may process sound information input or output through a speaker 1182, a receiver 1184, earphones 1186, or microphone 1188.

The camera module 1191 refers to a device that may take both still and moving images. The camera module 1191 is capable of including one or more image sensors (e.g., a front image sensor or a rear image sensor), a lens, an image signal processor (ISP), or a flash (e.g., an LED or xenon lamp).

The power management module 1195 may manage the power of the electronic device 1101. The power management module 1195 is capable of including a power management IC (PMIC), a charger IC, or a battery gauge. The PMIC may employ wired charging and/or wireless charging methods. Wireless charging methods may include magnetic resonance charging, magnetic induction charging, and electromagnetic charging. To this end, the PMIC may further include an additional circuit for wireless charging, such as a coil loop, a resonance circuit, or a rectifier. The battery gauge may measure a residual capacity, a charge, a current, or a temperature of the battery 1196. The battery 1196 may take the form of either a rechargeable battery or a solar battery.

The indicator 1197 may display a specific status of the electronic device 1101 or a part thereof (e.g., the processor 1110), such as a boot-up status, a message status, or a charging status. The motor 1198 may convert an electrical signal into mechanical vibrations, such as a vibration effect or a haptic effect. The electronic device 1101 may further include a processing unit (e.g., a GPU) for supporting a mobile TV. The processing unit for supporting a mobile TV may process media data pursuant to a standard, such as digital multimedia broadcasting (DMB), digital video broadcasting (DVB), or mediaFlo™.

Figure 12:
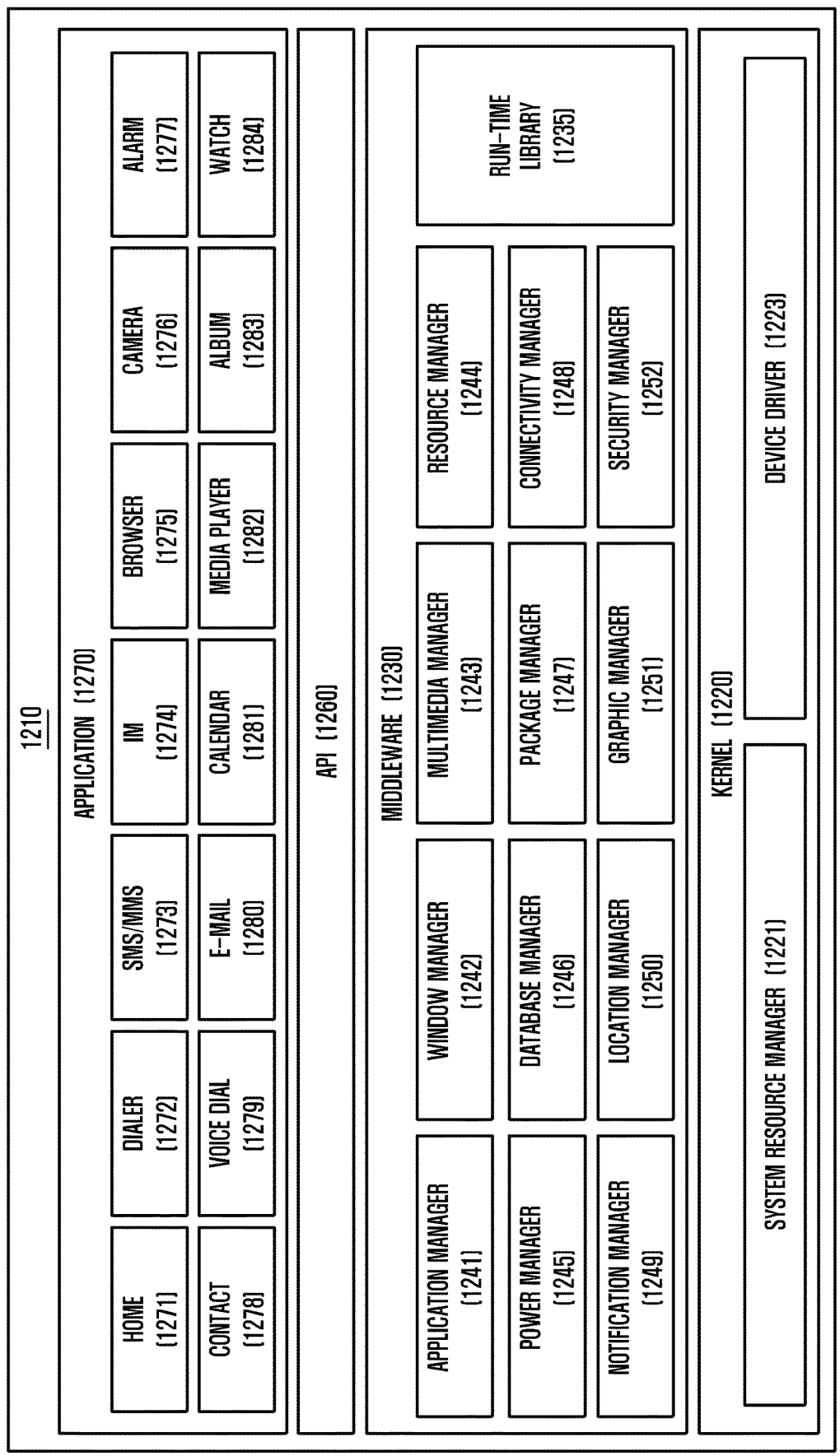
FIG. 12 illustrates a program module, according to an embodiment.

FIG. 12 illustrates a programming module, according to an embodiment.

Referring to FIG. 12, the program module 1210 may include an OS for controlling resources related to the electronic device and/or various applications running on the OS. The OS may be Android™, iOS™, Windows™, Symbian™, Tizen™, or Bada™.

The program module 1210 may include a kernel 1220, middleware 1230, an API 1260 and/or applications 1270. At least a part of the program module 1210 may be preloaded on the electronic device or downloaded from the electronic device 102 or 104, or the server 106.

The kernel 1220 may include a system resource manager 1221 and/or a device driver 1223. The system resource manager 1221 may include a process manager, a memory manager, and a file system manager. The system resource manager 1221 may perform system resource control, allocation, and recall. The device driver 1223 may include a display driver, a camera driver, a BT driver, a shared memory driver, a USB driver, a keypad driver, a WiFi driver, and an audio driver. Further, the device driver 1223 may include an inter-process communication (IPC) driver.

The middleware 1230 may provide a function required in common by the applications 1270. Further, the middleware 1230 may provide a function through the API 1260 to allow the applications 1270 to efficiently use limited system resources within the electronic device. The middleware 1230 may include at least one of a runtime library 1235, an application manager 1241, a window manager 1242, a multimedia manager 1243, a resource manager 1244, a power manager 1245, a database manager 1246, a package manager 1247, a connection manager 1248, a notification manager 1249, a location manager 1250, a graphic manager 1251, and a security manager 1252.

The runtime library 1235 may include a library module used by a complier to add a new function through a programming language while the applications 1270 are executed. The runtime library 1235 may manage input and output, management of a memory, and a function associated with an arithmetic function.

The application manager 1241 may manage a life cycle of at least one of the applications 1270. The window manager 1242 may manage GUI resources used on the screen. The multimedia manager 1243 may detect a format required for reproducing various media files and perform an encoding or a decoding of a media file by using a codec suitable for the corresponding format. The resource manager 1244 may manage resources such as a source code, a memory, or a storage space of at least one of the applications 1270.

The power manager 1245 may manage battery capacity, temperature, or power, and may determine or provide power information that is necessary for the operation of an electronic device using the corresponding information.

The power manager 1245 may operate together with a basic input/output system (BIOS) to manage a battery or power and provides power information required for the operation. The database manager 1246 may generate, search, and change database to be used by at least one of the applications 1270. The package manager 1247 may manage an installation or an update of an application distributed in the form of a package file.

The connection manager 1248 may manage, for example, a wireless connection such as WiFi or BT. The notification manager 1249 may display or notify a user of an event such as an arrival message, an appointment, or a proximity alarm, in a manner that does not disturb the user. The location manager 1250 may manage location information of the electronic device. The graphic manager 1251 may manage a graphic effect provided to the user or a user interface related to the graphic effect. The security manager 1252 provides a general security function required for system security or user authentication. When the electronic device has a call function, the middleware 1230 may further include a telephony manager for managing a voice of the electronic device or a video call function.

The middleware 1230 may include modules for configuring various combinations of functions of the above described components. The middleware 1230 may provide modules specialized according to types of OSs to provide distinct functions. The middleware 1230 may be adaptively configured in such a way so as to remove part of the existing components or to include new components.

The API 1260 may be a set of API programming functions, and may be provided with a different configuration according to an OS. In Android™ or iOS™, a single API set may be provided for each platform. In Tizen™, two or more API sets may be provided.

The applications 1270 may include one or more applications for performing various functions, such as a home 1271 function, a diary 1272 function, a SMS/MMS 1273 function, an instant message (IM) 1274 function, a browser 1275 function, a camera 1276 function, an alarm 1277 function, a contact 1278 function, a voice dial 1279 function, an email 1280 function, a calendar 1281 function, a media player 1282 function, an album 1283 function, a clock 1284 function, a health care function, such as an application for measuring amount of exercise or blood sugar level, and an environment information function, such as an application for providing atmospheric pressure, humidity, or temperature.

The applications 1270 may include an application for supporting information exchange between an electronic device 101 and the electronic devices 102 and 104, which is hereafter called an "information exchange application". The information exchange application is capable of including a notification relay application for relaying specific information to external devices or a device management application for managing external devices.

The notification relay application may include a function for relaying notification information created in other applications of the electronic device, such as an SMS/MMS application, an email application, a health care application, or an environment information application, to the electronic devices 102 and 104. In addition, the notification relay application may receive notification information from external devices to provide the received information to the user.

The device management application may manage (e.g., install, remove or update) at least one function of the electronic devices 102 and 104 for communicating with the electronic device 101. For example, the device management application may manage turning on/off the external device or part of the external device, controlling the brightness (or resolution) of the display, applications running on the external device, or services (i.e., a call service or a messaging service) provided by the external device.

The applications 1270 may include an application (e.g., a health care application of a mobile medical device) specifying attributes of the electronic devices 102 and 104. The applications 1270 may include applications received from the server 106, or electronic devices 102 and 104. The applications 1270 are capable of including a preloaded application or third party applications that can be downloaded from a server. It should be understood that the components of the program module 1210 may be called different names according to types of OSs.

At least part of the program module 1210 can be implemented with software, firmware, hardware, or any combination thereof. At least a part of the program module 1210 can be implemented (e.g., executed) by a processor (e.g., processor 1110). At least part of the programing module 1210 may include modules, programs, routines, sets of instructions or processes, in order to perform one or more functions.

The term "module" used in this disclosure may refer to a certain unit that includes one of hardware, software and firmware, or any combination thereof. The term "module" may be interchangeably used with "unit", "logic", "logical block", "component", or "circuit".

A module may be the minimum unit, or part thereof, which performs one or more particular functions. The module may be formed mechanically or electronically. The module may include at least one of an application specific integrated circuit (ASIC) chip, a field programmable gate array (FPGA), and a programmable-logic device, which are known or are to be developed.

The non-transitory computer-readable recording medium may include magnetic media such as a hard disk, a floppy disk, a magnetic tape, optical media such as a compact disc read only memory (CD-ROM) and a digital versatile disc (DVD), a magneto-optical media such as a floptical disk, and hardware devices specially configured to store and perform a program instruction. In addition, the program instructions may include high class language codes, which can be executed in a computer by using an interpreter, as well as machine codes made by a compiler. The aforementioned hardware device may be configured to operate as one or more software modules in order to perform the operation of embodiments of the present disclosure, and vice versa.

A module, or programming module, may include or exclude at least one of the above-discussed elements or further include any other element. The operations performed by the module, programming module or any other element may be executed sequentially, in parallel, repeatedly, or by a heuristic method. Additionally, some operations may be executed in a different order, omitted, or any other operation may be added.

While the present disclosure has been particularly shown and described with reference to certain embodiments thereof, it will be understood by those of ordinary skill in the art that various changes in form and details may be made therein without departing from the spirit and scope of the present disclosure as defined by the following claims and their equivalents.

What is claimed is:

1. An electronic device, comprising:
   a display;
   a biometric sensor disposed under the display;
   a circuit board including the biometric sensor on a first surface thereof; and
   a force sensor formed on a second surface of the circuit board,
   wherein the force sensor comprises:
      a first electrode layer facing the second surface;
      a dielectric layer disposed under the first electrode layer; and
      a second electrode layer disposed under the dielectric layer and connected to a ground of the electronic device.

2. The electronic device of claim 1, wherein the second electrode layer includes a bracket of the electronic device.

3. The electronic device of claim 2, wherein the second electrode layer is insulated from an external bracket in order to prevent interference and functions as the ground corresponding to the force sensor.

4. The electronic device of claim 3, further comprising a metal housing,
   wherein the external bracket is connected to the metal housing and at least partially performs an antenna function using the metal housing.

5. The electronic device of claim 3, wherein the external bracket is formed based on a size of the bracket corresponding to the second electrode layer.

6. The electronic device of claim 3, further comprising an electric shock prevention capacitor configured to prevent an electric shock, the electric shock prevention capacitor being connected between the external bracket and the circuit board.

7. The electronic device of claim 1, wherein the first electrode layer is disposed in at least a portion within the circuit board.

8. The electronic device of claim 1, wherein the force sensor detects a pressure corresponding to a touch input that is input through the display based on a thickness change of the dielectric layer disposed between the first electrode layer and the second electrode layer.

9. The electronic device of claim 1, wherein the force sensor is disposed to correspond to the biometric sensor, and
wherein a layer of the force sensor is distinguished from that of other force sensors disposed irrespective of the biometric sensor.

10. The electronic device of claim 1, wherein a predetermined air gap is formed between the first electrode layer and the second electrode layer, and
wherein a pressure corresponding to a touch input that is input through the display is detected based on a gap change of the predetermined air gap.

11. The electronic device of claim 1, further comprising a support member disposed under the display,
wherein the biometric sensor is attached to at least a portion of the support member.

12. The electronic device of claim 1, wherein the biometric sensor forms a predetermined air gap between the display, and
wherein a step compensation member configured to maintain the predetermined air gap is disposed under the display.

13. An electronic device, comprising:
a display;
a biometric sensor disposed under the display;
a circuit board connected to the biometric sensor and disposed under the biometric sensor; and
a force sensor formed between the biometric sensor and the circuit board,
wherein the force sensor comprises:
a first electrode layer facing the biometric sensor;
a dielectric layer disposed under the first electrode layer; and
a second electrode layer disposed under the dielectric layer and connected to a ground of the electronic device, and
wherein the second electrode layer is formed in at least a portion of the circuit board.

14. The electronic device of claim 13, wherein the biometric sensor is attached under the display using an optical clear adhesive, and
wherein a predetermined air gap is formed between a first electrode layer facing the biometric sensor and a second electrode layer formed in at least a portion of the circuit board.

15. The electronic device of claim 14, wherein a pressure corresponding to a touch input that is input through the display is detected based on a gap change of the predetermined air gap.

16. The electronic device of claim 14, wherein a step compensation member is disposed under the display in order to form the predetermined air gap between the first electrode layer and the second electrode layer.

17. The electronic device of claim 13, further comprising a support member disposed under the display,
wherein the biometric sensor is attached to at least a portion of the support member.

18. The electronic device of claim 13, wherein the biometric sensor is formed in a concave shape or a convex shape, and
wherein the force sensor is disposed under the biometric sensor based on the biometric sensor formed in the concave shape or the convex shape.

19. The electronic device of claim 13, wherein the force sensor is disposed under the biometric sensor based on a size of the biometric sensor.

* * * * *